United States Patent
Wells et al.

(10) Patent No.: US 6,760,223 B2
(45) Date of Patent: Jul. 6, 2004

(54) APPARATUS AND METHOD FOR CONTACTING DEVICE WITH DELICATE LIGHT-TRANSPARENT PANE

(75) Inventors: Gary A. Wells, Fremont, CA (US); Stephen R. Childress, Scotts Valley, CA (US)

(73) Assignee: NPTest, Inc., San Jose, CA (US)

( * ) Notice: Subject to any disclaimer, the term of this patent is extended or adjusted under 35 U.S.C. 154(b) by 0 days.

(21) Appl. No.: 10/284,630

(22) Filed: Oct. 30, 2002

(65) Prior Publication Data

US 2004/0084765 A1 May 6, 2004

(51) Int. Cl.[7] .................................................. H05K 7/20
(52) U.S. Cl. .................... 361/704; 165/80.2; 165/185; 165/80.3; 257/706; 257/713; 257/719; 257/727; 361/710; 361/719; 361/720; 361/708
(58) Field of Search .................. 165/80.2, 80.3, 165/185; 257/705–706, 712–713, 718–719, 726–727; 361/704–710, 714, 722, 715, 719–720

(56) References Cited

U.S. PATENT DOCUMENTS

| | | | | | |
|---|---|---|---|---|---|
| 5,869,883 | A | * | 2/1999 | Mehringer et al. | 257/667 |
| 5,895,972 | A | * | 4/1999 | Paniccia | 257/706 |
| 5,901,039 | A | * | 5/1999 | Dehaine et al. | 361/704 |
| 5,917,704 | A | * | 6/1999 | Trublowski et al. | 361/705 |
| 6,282,093 | B1 | * | 8/2001 | Goodwin | 361/704 |
| 6,400,577 | B1 | * | 6/2002 | Goodwin et al. | 361/816 |
| 6,412,546 | B1 | * | 7/2002 | Lin et al. | 165/80.3 |
| 6,501,658 | B2 | * | 12/2002 | Pearson et al. | 361/709 |

\* cited by examiner

*Primary Examiner*—Greg Thompson

(57) ABSTRACT

A heat-sinking apparatus (62, 64, 66, and 68) containing a light-transparent pane (72) is configured in a way that enables the pane to be brought into contact with a device (40) such as a semiconductor device without significantly damaging the pane. A main spreader body (120) of a heat spreader (66) in the heat-sinking apparatus preferably consists largely of copper and is connected to the pane, preferably consisting largely of diamond, by way of a combination of metals that facilitates heat transfer from the pane to the heat spreader.

28 Claims, 11 Drawing Sheets

APPARATUS AND METHOD FOR CONTACTING DEVICE WITH DELICATE LIGHT-TRANSPARENT PANE

FIELD OF USE

This invention relates to contacting devices, especially semiconductor devices during laser probing.

BACKGROUND ART

Semiconductor devices can be tested in various ways. One test technique involves probing a semiconductor device with light finished by a laser. During such testing, ohmic heating in the device causes its temperature to rise. Inasmuch as excessive heat can damage a semiconductor device, a heat sink is commonly provided for removing heat from the device. The heat sink can take various forms.

Referring to FIG. 1, U.S. Pat. No. 5,895,972 illustrates how an uncapped semiconductor device 10 provided with flip-chip packaging is conventionally probed with infrared ("IR") light 12 provided from IR laser 14. Device 10 consists of semiconductor die 16, ball bonds 18, package 20, and pins 22 arranged as indicated in FIG. 1. Because device 10 is uncapped, only part of package 20 appears in FIG. 1. Incident IR light 12 strikes metallic part 24 of die 16. Portion 26 of incident light 12 is reflected off part 24 and detected by light detector 28.

During laser probing, heat is removed from semiconductor device die 16 by a heat sink consisting of thermally conductive IR-transparent pane 30 and heat spreader 32 that overlies and contacts one of the faces of die 16. Incident light 12 and reflected light 26 pass through pane 30 formed with IR-transparent material such as diamond. Heat spreader 32, typically consisting of copper or aluminum, is thermally connected to pane 30 generally along its outer lateral periphery. Heat produced in die 16 is transported through pane 30 to spreader 32 where the heat energy spreads out and dissipates.

IR-transparent panes, such as pane 30, are typically quite delicate, especially since they need to be relatively thin to transmit an adequate fraction of incident IR light. Such IR-transparent panes can readily be damaged when they are brought into contact with semiconductor devices that are to undergo testing, particularly laser probing. Accordingly, it would be desirable to have a technique for contacting a semiconductor device with a delicate IR-transparent pane in such a manner as to substantially reduce the likelihood of damaging the pane. It would also be desirable to improve the heat transfer from the semiconductor device through the pane to an adjacent heat spreader.

GENERAL DISCLOSURE OF THE INVENTION

The present invention furnishes an apparatus and associated method for bringing a device, such as a semiconductor device, into contact with a light-transparent pane in a way that can be readily controlled to substantially avoid damaging the pane. Light provided, for example, by a laser for probing the device can be directed toward the pane from opposite the device so as to pass through the pane and impinge on the device.

More particularly, an apparatus in accordance with the invention contains a contacting component, a pane component, a heat spreader, and an attachment mechanism. The contacting component contacts the device. The pane component includes a light-transparent pane for contacting the device. The heat spreader contacts, or is connected to, the pane component.

The attachment mechanism attaches the heat spreader to the contacting component across an adjustable spacing between the heat spreader and the contacting component. The attachment mechanism also adjusts the adjustable spacing between the heat spreader and contacting component, and three-dimensionally restricts movement of the heat spreader relative to the contacting component across the adjustable spacing. With the pane component positioned close to the device, the attachment mechanism is adjusted to reduce the spacing between the heat spreader and the contacting component so as to cause the light-transparent pane to contact the device.

As the adjustable spacing is being adjusted, the attachment mechanism exerts a primary force on the heat spreader toward the contacting component across the adjustable spacing. This causes the device to exert a corresponding force on the pane. The attachment mechanism preferably employs one or more springs in such a manner that the force exerted by the attachment mechanism on the heat spreader varies across a relatively small range. As a result, the force exerted by the device on the pane is limited to some maximum value. By choosing the force exerted by the device on the pane to be sufficiently small as the spacing between the heat spreader and contacting component is adjusted to bring the pane into contact with the device, the pane does not undergo significant damage due to contacting the device.

The heat spreader is preferably implemented as a main spreader body formed with copper and an overlying surface layer formed with gold. This combination of metals improves the heat transfer from the pane to the spreader. When the heat spreader is connected through indium to a surface region of the pane component, the indium and the gold of the spreader surface layer typically achieve a good thermal connection to further improve the heat transfer.

BRIEF DESCRIPTION OF THE DRAWINGS

Like reference symbols are employed in the drawings and in the description of the preferred embodiments to represent the same, or very similar, item or items.

DESCRIPTION OF THE PREFERRED EMBODIMENTS

Figure 2:
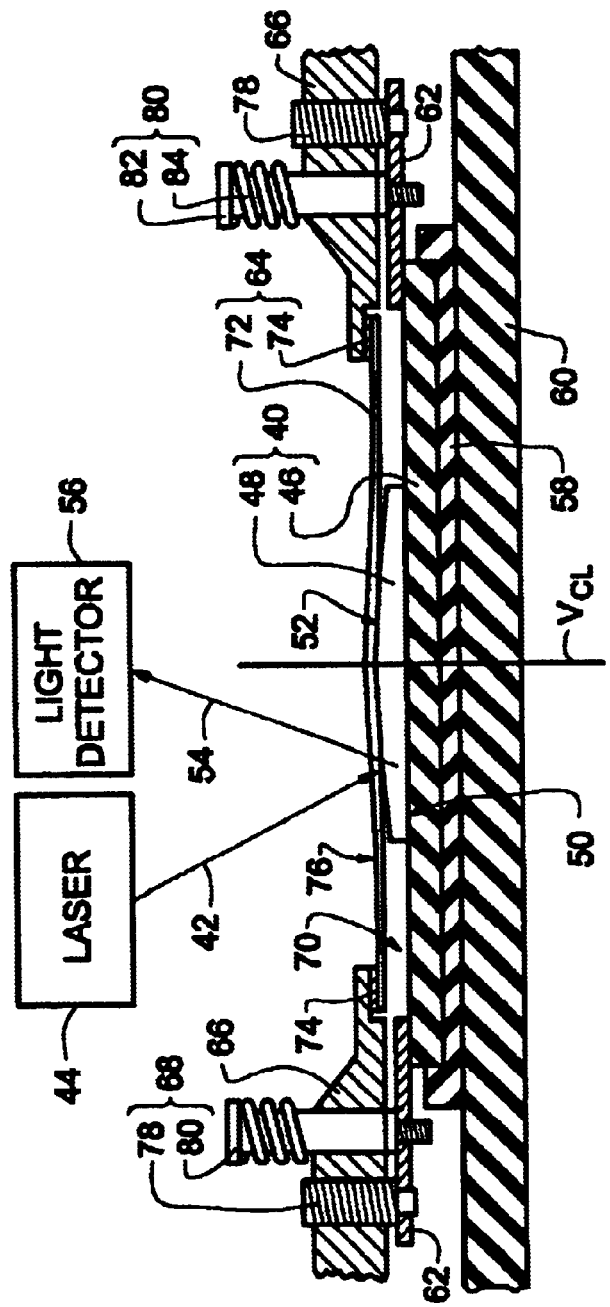
FIG. 2 is a composite block diagram/cross-sectional side view of pan of a semiconductor device and a heat-sinking apparatus configured according to the invention for laser probing of the-device.

FIG. 2 illustrates generally how a heat-sinking apparatus configured according to the invention is arranged with respect to an uncapped semiconductor device 40 for enabling device 40 to be probed with light 42 provided from a laser 44. Light 42 is typically infrared (again, "IR" light. However, light 42 can be visible or ultraviolet ("UV") light.

Semiconductor device 40 includes an electrically insulating package 46 and a semiconductor die 48 that contacts package 46 along an interface 50. Only part of package 46 appears in FIG. 2 because device 40 is uncapped. Package 46 and die 48 are each typically of square lateral shape. Die 48 has an exposed face 52 opposite interface 50.

Semiconductor die 48 consists principally of a monocrystalline silicon semiconductor substrate (not separately indicated) and an adjoining electrical interconnection system (also not separately indicated). The silicon substrate is divided into regions variously doped with n-type and p-type semiconductor impurities. A light-transparent electrically insulating layer (likewise not separately indicated) of silicon oxide lies along the surface of the silicon substrate opposite the electrical interconnection system.

Figure 1:
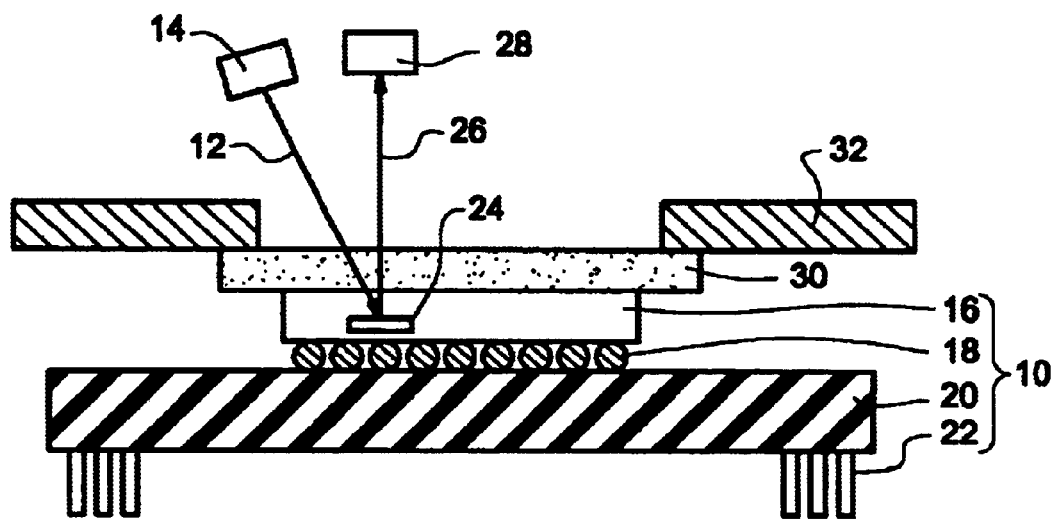
FIG. 1 is a composite block diagram/cross-sectional side view of a semiconductor device and a conventional heat sink during laser probing of the device.

Similar to semiconductor device 10 in FIG. 1, semiconductor device 40 in FIG. 2 is typically provided with flip-chip packaging in which semiconductor die 48 is oriented upside down relative to the standard orientation of a semiconductor die to its package. In the flip-chip case, interface 50 is formed by the junction of package 48 and the electrical interconnection system of die 48 while exposed face 52 is formed by the silicon oxide layer situated along the silicon substrate opposite the interconnection system. Ball bonds (not shown) situated along face 50 in the flip-chip case electrically connect bond pads of die 48 to metal pins (not shown) that extend through package 46 and protrude out of its lower surface in the orientation of FIG. 2. During the decappinig of device 40, the exposed material of die 48 is polished in such a way that face 52 is of convex shape.

Laser 44 is situated above exposed face 52 of semiconductor die 48. Light 42 thus impinges on die 48 without passing through package 46. A portion 54 of light 44 is reflected off internal portions of die 48 and is detected/collected by a light detector 56 likewise situated above face 52. The reflections typically occur off the interconnection) system close to interface 50. Reflected light 54 is ER, visible, or UV light depending on whether incident light 44 is IR, visible, or UV light.

Package 46 is plugged into an opening in a socket 58 provided on a printed-circuit board ("PCB") 60. Part of package 46 may extend above the socket opening. This situation is depicted in FIG. 2.

The heat-sinking apparatus in FIG. 2 is formed with a metallic contacting component 62, a pane component 64, a thermally conductive metallic heat spreader 66, and an attachment mechanism 68. The heat-sinking apparatus also typically includes a metallic cooling plate (not shown) connected to heat spreader 66 generally along its outer lateral periphery. The cooling plate has channels through which cold air moves for cooling spreader 66.

Contacting component 62, also referred to as the device clamp, is a flat metallic plate having a central opening 70 slightly smaller than the lateral shape of package 46. The heatsinking apparatus is positioned so that the lower surface of contacting component 62 contacts the upper surface of package 46. This contact occurs between an annular lower-surface portion of component 62 along its inner lateral periphery and an annular upper-surface portion of package 46 along its outer lateral periphery. Although component 62 contacts package 46, component 62 is not bonded to package 46. The support structure formed by socket 58 and PCB 60 thereby cooperates with component 62 to hold (or clamp) semiconductor device 40. Component 62 is typically of round lateral shape but can have other lateral shapes.

Pane component 64 consists of a light-transparent pane 72 and a thermally conductive annular pane surface region 74 provided at least partially on the upper surface of pane 72 generally along its outer lateral periphery. Pane 72 is situated above all of semiconductor die 48 and contacts die 48 along part or all of face 52 during laser probing FIG. 2 illustrates an example in which pane 72 contacts die 48 along part of face 52 during laser probing. In any event, pane 72 conforms to the convex shape of face 52 along the contact area so as to achieve good thermal contact between pane component 64 and die 48. Pane 72 is typically of generally square lateral shape but can have other lateral shapes.

Pane 72 is normally transparent to at least IR light. Additionally or alternatively, pane 72 can be transparent to visible and/or UV light. Pane 72 is formed with light-transparent material of high thermally conductivity. The pane material is preferably diamond. The thickness of pane 72 is then 200–400 $\mu$m, typically 300 $\mu$m. Alternatively or additionally, pane 72 can be formed with sapphire, silicon, germanium, or/and gallium arsenide.

FIG. 2 illustrates an example in which substantially all of pane surface region 74 lies on the upper surface of pane 72. Alternatively, part of surface region 74 can cover part or all of the lateral edge of pane 72. Information on the constituency of surface region 74 is presented below in connection with FIGS. 9a and 9b.

Heat spreader 66 is a body of high thermally conductivity. Spreader 66 is thermally connected to pane component 64 to provide a path by which heat generated in semiconductor die 48 is transported through component 64 to spreader 66 where the heat energy spreads out and dissipates. The thermal connection between pane component 64 and spreader 66 is typically achieved by bonding part of spreader 66 to part of component 64 with metal such as solder. Further information on this type of thermal connection between spreader 66 and component 64 is presented below in connection with FIGS. 9a and 9b.

Heat spreader 66 has a central opening 76 slightly smaller than the outer lateral shape of pane component 64. The thermal connection between spreader 66 and component 64 is made along opening 76. Specifically, the upper surface of pane surface region 74 is thermally connected to an annular portion of the lower surface of spreader 66 along its inner lateral periphery. In FIG. 2, the portion of spreader 66 thermally connected to surface region 74 is recessed upward (counterbored) slightly. Spreader 66 is typically of circular outer lateral shape but can have other outer lateral shapes.

To achieve the required high thermally conductivity, heat spreader 66 preferably consists primarily of copper. However, as discussed below in connection with FIGS. 9a and 9b, one or more thin layers of other metals are provided over the copper to achieve good thermal connection to pane component 64. This preferably includes a thin surface layer of gold.

Attachment mechanism 68 performs four basic functions: (a) attaching heat spreader 66 to contacting component 62 across an adjustable spacing between spreader 66 and component 62, (b) adjusting the spacing between spreader 66 and component 62, (c) exerting a primary force on spreader 66 toward component 62 across the adjustable spacing between spreader 66 and component 62 so as to cause semiconductor device 40, specifically semiconductor die 48, to exert a corresponding force on light-transparent pane 72, and (d) three-dimensionally restricting the movement of spreader 66 relative to component 62 across the adjustable spacing between spreader 66 and component 62. Inasmuch as contacting component 62 is also referred to as a clamp, the adjustable spacing between spreader 66 and component 62 is hereafter often referred to as the "spreader-to-clamp adjustable spacing" The spreader-to-clamp adjustable spacing varies from a suitable minimum value, typically zero or a value close to zero, to a suitable maximum value dependent on the characteristics of attachment mechanism 68.

Light-transparent pane 72 comes into contact with semiconductor die 48 at some value of the spreader-to-clamp adjustable spacing. As the spreader-to-clamp adjustable spacing is reduced below this value, pane 72 drapes over die 48 in the manner generally shown in FIG. 2. Attachment mechanism 68 is normally configured so that the variation of the force exerted by mechanism 68 on spreader 66 toward contacting component 62 is relatively small across the spreader-to-clamp adjustable spacing, i.e., across every value of the spreader-to-clamp spacing for which spreader 66 is attached to component 62 by way of mechanism 68. As a consequence, the force exerted by die 48 on pane 72 is limited to a readily controllable maximum value as mechanism 68 reduces the spacing between spreader 66 and component 62, and thus as pane 72 comes into contact with die 48 and progressively drapes over die 48.

The force that die 48 exerts on pane 72 due to the spacing adjustment provided by attachment mechanism 68 typically varies across a relatively small range. By choosing the characteristics of mechanism 68 so that the force exerted by die 48 on pane 72 due to the spacing adjustment provided by mechanism 68 is sufficiently small, the likelihood of pane 72 being significantly damaged as a result of coming into contact with die 48 and being draped over die 48 is normally quite low. In other words, utilizing mechanism 68 to bring pane 72 into progressively greater contact with die 48 substantially prevents pane 72 from undergoing damage due to such contact.

Attachment mechanism 68 includes one or more adjustment elements 78 and one or more spring-loaded attachment elements 80. There are normally an even number of adjustment elements 78 and an even number of attachment elements 80. The even number of attachment elements 80 is typically the same as, but can differ from, the even number of adjustment elements 78. Each different pair of the even number of elements 78 or 80 arc normally situated opposite each other with respect to a vertical line $V_{CL}$ that goes through the center of the heat-sinking apparatus.

FIG. 2 illustrates attachment elements 80 as being closer to the center of the heat-sinking apparatus than adjustment elements 78. Alternatively, adjustment elements 78 can be closer to the center of the heat-sinking apparatus than attachment elements 80. See FIGS. 3a and 3b discussed below. For convenience in illustration, FIG. 2 depicts a pair of oppositely positioned adjustment elements 78 as being in the same vertical plane as a pair of oppositely positioned attachment elements 80. However, each pair of oppositely positioned attachment elements 80 can be, and typically are, in a different vertical plane than each pair of oppositely positioned adjustment elements 78.

Adjustment elements 78 adjust the spreader-to-clamp adjustable spacing and determine its minimum value. Each element 78 is implemented as an adjustment screw (or bolt) having a threaded portion that screws into a thread hole through heat spreader 66. Each element 78 has a surface portion that contacts contacting component 62. The spreader-to-clamp adjustable spacing is adjusted by screwing elements forward or backward in their thread holes through spreader 66.

In the example of FIG. 2, each adjustment element 78 has an end portion that extends through an opening in contacting component 62. This laterally restricts the movement of heat spreader 66 relative to component 62. However, elements 78 do not attach spreader 66 to component 62. Hence, elements 78 establish the minimum spacing between spreader 66 and component 62 but not the maximum spacing between spreader 66 and component 62.

Spring-loaded attachment elements 80 attach heat spreader 66 to contacting component 62 across the spreader-to-clamp adjustable spacing, exert the primary force on spreader 66 toward component 62 so as to cause semiconductor die 48 to exert the above-mentioned corresponding force on light-transparent pane 72, three-dimensionally restrict the movement of spreader 66 relative to component 62 across the spreader-to-clamp adjustable spacing, and determine the maximum value of the spreader-to-clamp adjustable spacing. Each attachment element 80 is implemented here with a support element 82 and a spring 84. Each support element 82 here is a shoulder bolt consisting of (a) a post that extends through an opening in spreader 66, (b) an attaching portion that extends from the post, and (c) a head that extends from the post opposite the attaching portion and is of greater diameter than the post. The attaching portions of support elements 82 are threaded and screw into thread holes through components 62 to attach attachment elements 80 to component 62.

Each spring 84 extends at least partway around the post of associated attaching element 82 between its head and heat spreader 66. The head of each element 82 is of sufficiently great diameter to keep associated spring 84 from being separated from that element 82. FIG. 2 illustrates an example in which each spring 84 is a coil spring that extends fully around the post of associated attaching element 82. Springs 84 can, however, be of various other shapes. In a typical implementation, catch spring 84 is a circular curved washer, i.e., a washer bent perpendicular to its axis so as to function as a spring Springs 84 exert the above-mentioned force on heat spreader 66 toward contacting component 62. As adjustment screws 78 are screwed back and forth to adjust the spreader-to-clamp adjustable spacing, springs 84 expand and compress. Springs 84 take up the slack present between the threads of adjustment screws 78 and the threads of the openings that receive screws 78 so as to control the force exerted by spreader 66 on component 62. The spring characteristics of springs 84 are preferably of such a nature that the variation of the force exerted by springs 84 on spreader 66 is relatively small across substantially the entire spreader-to-clamp adjustable spacing. At a minimum, the force exerted by springs 84 on spreader 66 varies only a relatively small amount across at least the portion of the spreader-to-clamp adjustable spacing in which light-transparent pane 72 goes from just touching semiconductor die 48 to reaching maximum contact with die 48. In either case, the resulting force exerted by die 48 on pane 72 is limited to a readily controllable maximum value so as to avoid damaging pane 72.

Figure 3A:
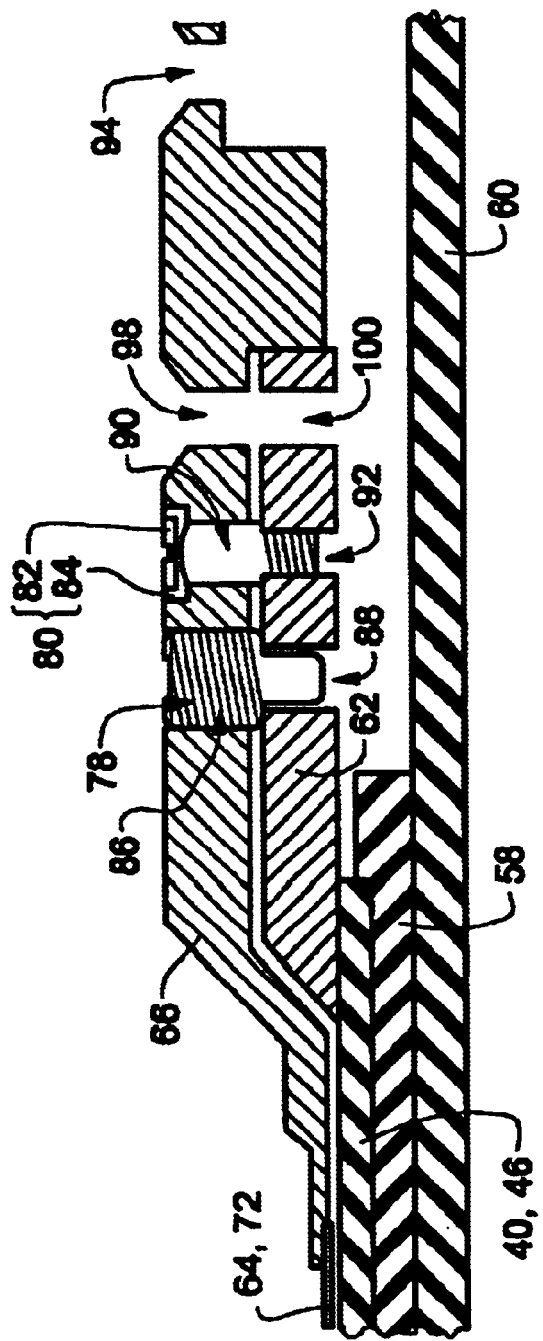
FIGS. 3a and 3b are cross-sectional side views of a part of an implementation of the semiconductor device and heat-sinking apparatus of FIG. 2 at two stages of bringing the device into contact with a light-transparent pane of the heat-sinking apparatus.
Figure 3B:
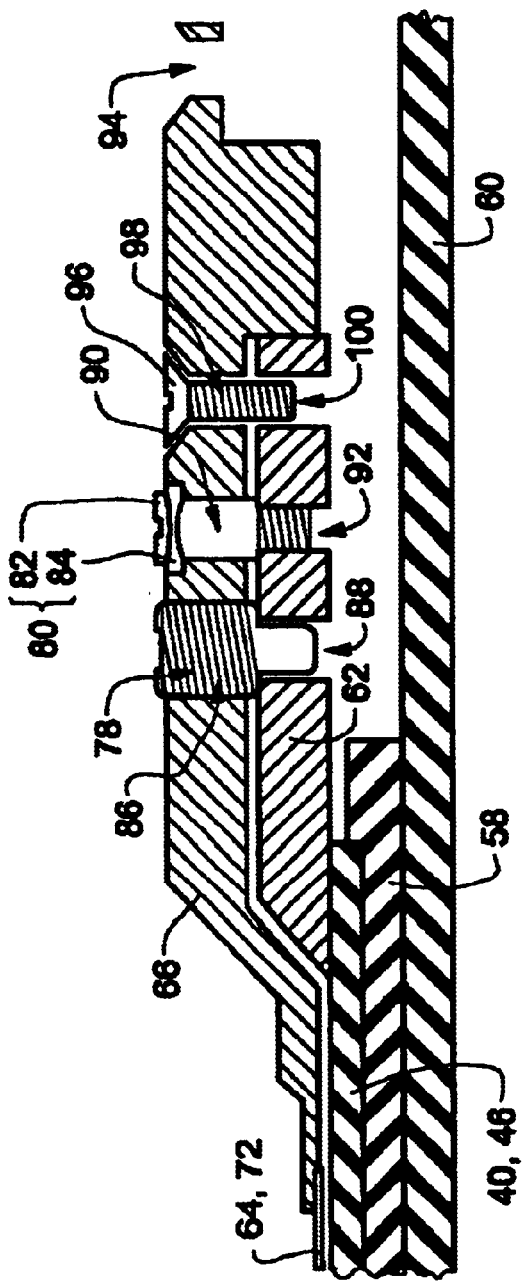

FIGS. 3a and 3b illustrate part of an implementation of semiconductor device 40, socket 58, PCB 60, and the heat-sinking apparatus formed with contacting component 62, pane component 64, heat spreader 66, and attachment mechanism 68 at two stages of bringing pane 72 into contact with semiconductor die 48 of device 40. Each of FIGS. 3a and 3b is taken along a plane extending through vertical centerline $V_{CL}$ of the heat-sinking apparatus. However, centerline $V_{CL}$ does not appear in FIGS. 3a or 3b because each of FIGS. 3a and 3b illustrates a cross-sectional segment taken to one side of centerline $V_{CL}$. The cross section of each of FIGS. 3a and 3b is also taken beyond the location of die 48 so that die 48 likewise does not appear in FIGS. 3a or 3b. The corresponding (unshown) cross section to the other side of centerline $V_{CL}$ is largely a mirror image of the illustrated cross section of each of FIGS. 3a and 3b. Pane surface region 74, which is quite thin, does not appear in FIGS. 3a or 3b.

One adjustment element 78 and one attachment element 80 are depicted in FIGS. 3a and 3b and thus appear in a common plane going through centerline V(L of the heat-sinking apparatus. The depiction of one element 78 and one element 80 in the same plane in FIGS. 3a and 3b is only for convenience in illustration. Each attachment element 80 may, and typically does, appear in a different plane going through centerline $V_{CL}$ than each adjustment element 78. Opposite to what is depicted in FIG. 2, FIGS. 3a and 3b illustrate the example in which adjustment elements 78 are closer to centerline $V_{CL}$ than are attachment elements 80.

In each of FIGS. 3a and 3b, items 86 and 88 respectively indicate openings through heat spreader 66 and contacting component 62 for illustrated adjustment element 78. Items 90 and 92 similarly respectively indicate openings through spreader 66 and component 62 for illustrated attachment element 80. Spreader 66 has a group of openings 94 for insertion of flat-head screws (not shown) to connect spreader 66 to the cooling plate (again, not shown). Spreader 66 can be corrected to the cooling plate in other ways.

Attachment mechanism 68 in the implementation of FIGS. 3a and 3b includes one or more constraining elements 96 for three-dimensionally restricting the movement of heat spreader 66 relative to contacting component 62 to less than the movement permitted by the one or more attachment elements 80. That is, the one or more constraining elements 96 constrain the movement of spreader 66 relative to component 62 more than the one or more elements 80. One such constraining element 96 is depicted in FIG. 3b. The one or more constraining elements 96 are utilized to firmly hold, or lock in, the final position of spreader 66 relative to component 62 after that position is established with the one or more adjustment elements 78 and the one or more attachment elements 80.

Figure 6:
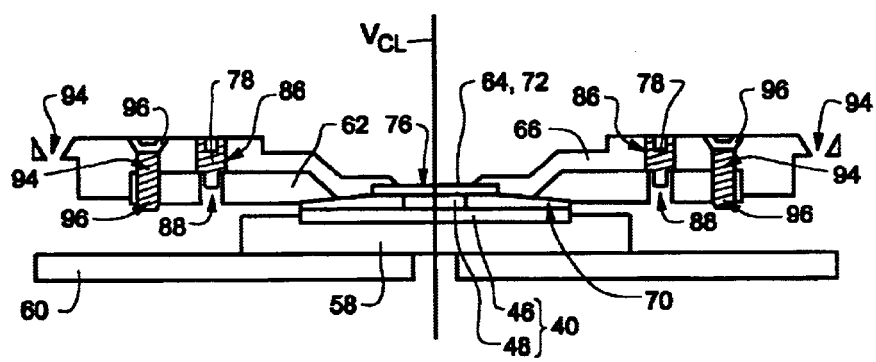
FIG. 6 is cross-sectional side view of the heat-sinking apparatus of FIGS. 4 and 5. The cross-section of FIG. 6 is taken through plane 6—6 in FIG. 5.
Figure 8:
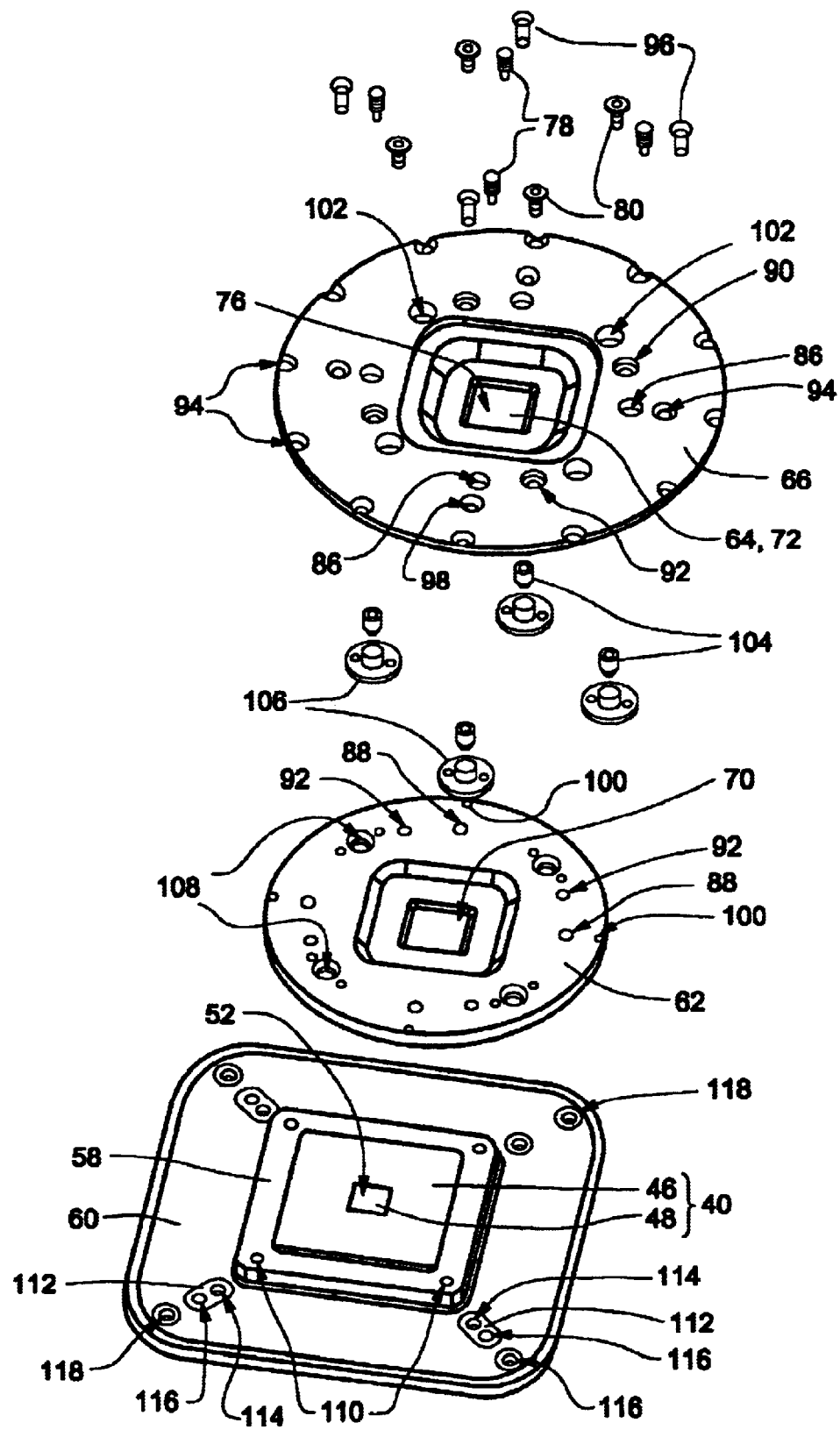
FIG. 8 is an exploded perspective view of the heat-sinking apparatus of FIGS. 4 and 5.

There is normally an even number of constraining elements 96 arranged, when present, so that an element 96 situated on one side of centerline $V_{CL}$ of the heat-sinking apparatus is opposite an element 96 situated on the other side of centerline $V_{CL}$. This arrangement of elements 96 can be seen in FIGS. 6 and 8 discussed below. The even number of constraining elements 96 is normally the same as the even number of adjustment elements 78, each element 96 being associated with a different one of elements 78. To avoid imbalancing the heat-sinking apparatus and possibly causing semiconductor die 48 to exert undesirably high force on light-transparent pane 72, each pair of oppositely positioned constraining elements 96 and the associated pair of oppositely positioned adjustment elements 78 are arranged generally in a plane that goes through centerline $V_{CL}$. As indicated in FIGS. 3b, 6, and 8, constraining elements 96 are normally further away from the center of the heat-sinking apparatus than are adjustment elements 78.

Each constraining element 96 is typically implemented with a screw or bolt that goes through a hole 98 in heat spreader 66 and screws into a threaded hole 100 in contacting component 62. FIGS. 3b, 6, and 8 illustrate an example in which elements 96 are flat-head screws. Holes 98 through spreader 66 are unthreaded.

The implementation of FIGS. 3a and 3b is utilized and operated in the following manner. Package 46 of semiconductor device 40 is plugged into socket 58 on PCB 60. The heat-sinking apparatus is initially spaced apart from device 40. That is, contacting component 62 is spaced apart from package 46, and pane 72 is spaced apart from semiconductor die 48.

Adjustment elements 78 and attachment elements 80 are in place in the heat-sinking apparatus with the spreader-to-clamp adjustable spacing at an initial value sufficiently high that pane 72 is spaced apart from die 48 when contacting component 62 initially contacts package 46. Achieving this condition may entail screwing adjustment elements 78 inward or outward in openings 86. Constraining elements 96 are initially not in holes 98 and 100 through spreader 66 and component 62.

The heat-sinking apparatus is positioned close to, typically directly above and spaced slightly apart from, semiconductor device 40 such that pane 72 is aligned to semiconductor die 48. Contacting component 62 is then brought into contact with device package 46. See FIG. 3a. Pane 72 is spaced apart from die 48 at this point. Adjustment elements 78 are now adjusted to progressively reduce the spacing between heat spreader 66 and component 62. This causes pane 72 to contact die 48 and progressively drape over die 48.

When a suitable final value of the spreader-to-clamp is achieved, constraining elements 96 are inserted into holes 98 and 100 to substantially lock in the desired final position of the heat-sinking apparatus. Elements 96 are typically screwed lightly into holes 98 and 100 so that the beveled lower surfaces of the heads of elements 96 just touch spreader 66. The cooling plate (again not shown) is now connected to spreader 66. In the example of FIGS. 3a and 3b, the connection of the cooling plate to spreader 66 is achieved with the above-mentioned flat-head screws inserted through holes 94 and into corresponding openings in the cooling plate. FIG. 3b illustrates the final position of the heat-sinking apparatus. With reference to FIG. 2, die 48 is subjected to laser probing by directing light 42 from laser 44 on pane 72 so that light 42 passes through pane 72 and impinges on die 48.

Figure 4:
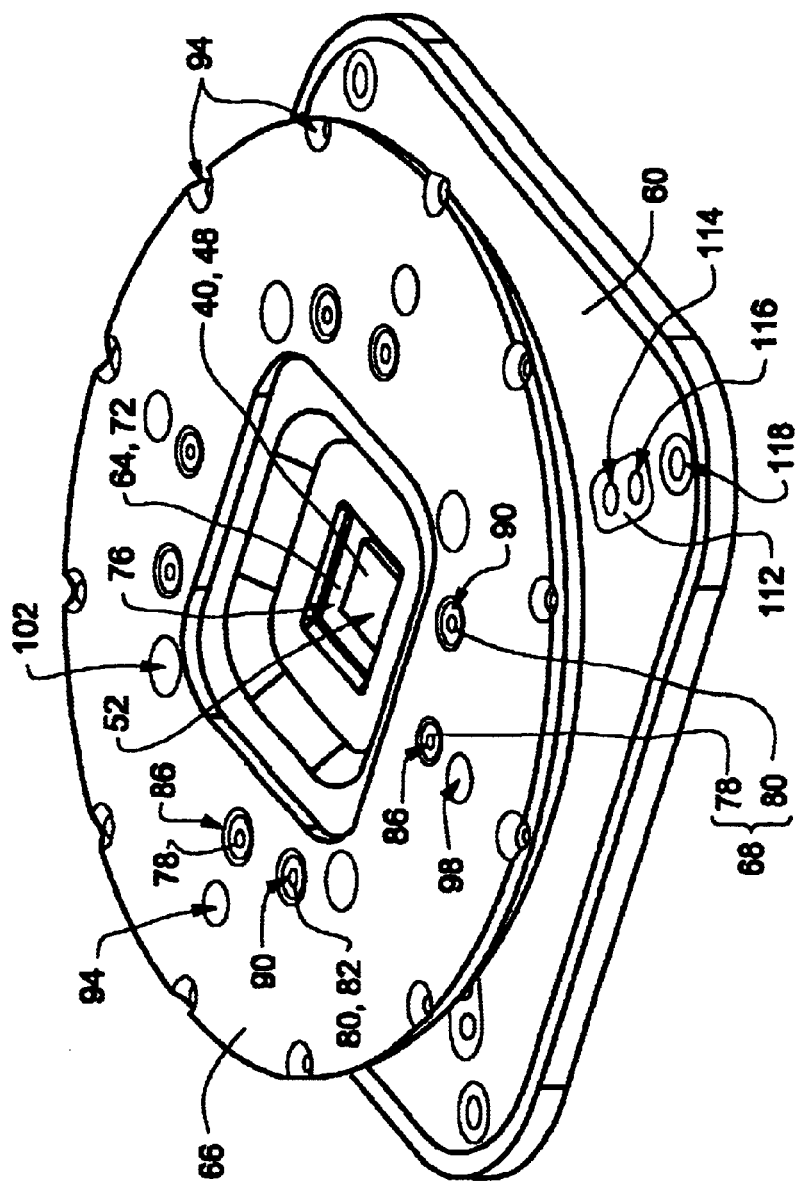
FIG. 4 is a perspective view of an implementation of the heat-sinking apparatus of FIG. 2.
Figure 5:
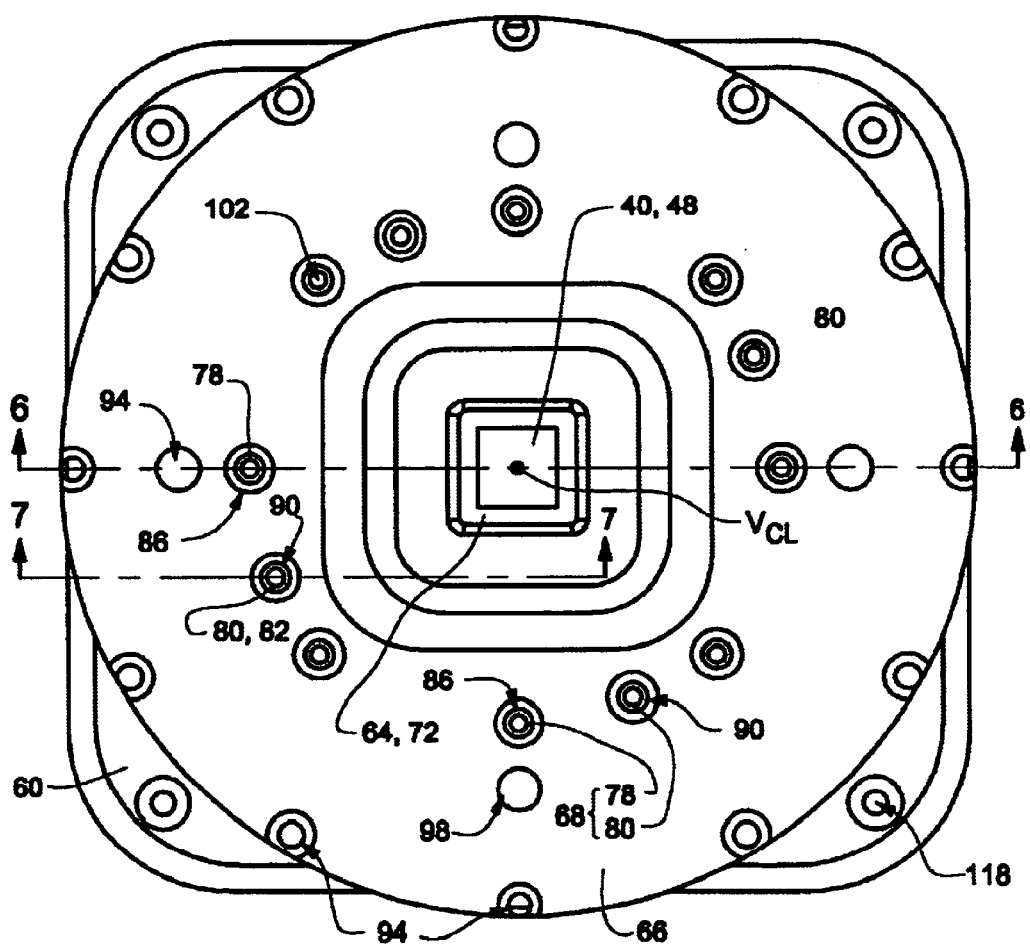
FIG. 5 is a plan view of the heat-sinking apparatus of FIG. 4.
Figure 7:
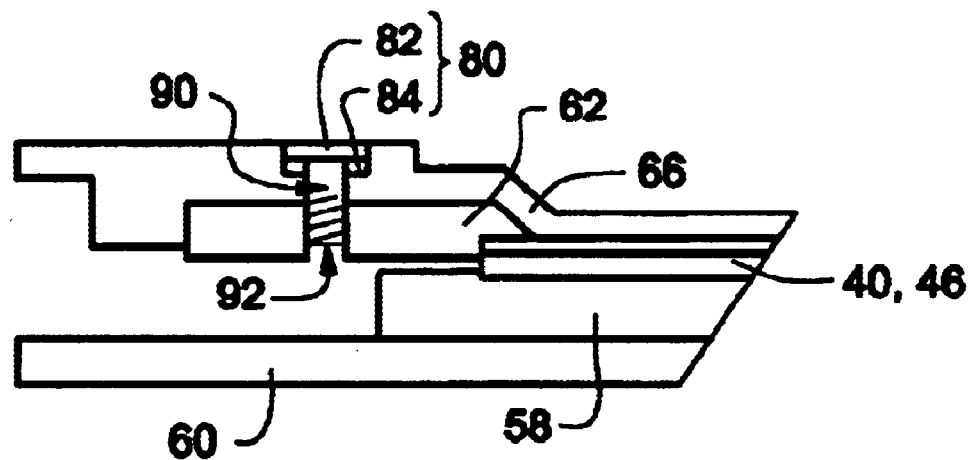
FIG. 7 is a cross-sectional side view of part of the heat-sinking apparatus of FIGS. 4 and 5. The cross-sectional of FIG. 6 is taken through plane 7—7 in FIG. 5.

FIGS. 4–8 illustrate a full implementation of the heat-sinking apparatus of FIG. 2. FIG. 4 is a perspective view. FIG. 5 is a top plan view. FIG. 6 is a full cross-sectional view taken through vertical centerline $V_{CL}$ for illustrating a pair of oppositely positioned adjustment elements 78 and the associated pair of oppositely positioned constraining elements 96. No attachment element 80 appears in FIG. 6. FIG. 7 is a partial cross-sectional view for illustrating an attachment element 80. FIG. 8 is an exploded perspective view. The implementation of FIGS. 4–8 corresponds to that of FIGS. 3a and 3b subject to each pair of oppositely positioned attachment elements 80 being in a different vertical plane through centerline $V_{CL}$ than each pair of oppositely positioned adjustment elements 78 and, when present, the associated pair of oppositely positioned constraining elements 96.

The implementation of FIGS. 4–8 has four adjustment elements 78 at substantially equal distances from centerline $V_{CL}$, four attachment elements 80 at substantially equal distances from centerline $V_{CL}$, and four constraining elements 96 at substantially equal distances from centerline $V_{CL}$. Each nearest pair of elements 78, 80, or 96 is at largely a 90° angle relative to centerline $V_{CL}$. Each attachment element 80 is, relative to centerline $V_{CL}$, at an angle of 20–30° to the nearest adjustment element 78 and the associated nearest constraining element 96.

Items 102 in heat spreader 66 of the implementation of FIGS. 4–8 are four through-holes for accessing contacting component 62. Referring especially to FIG. 8, spreader 66 consists of a main portion and four bottom-mounted adjustment bushings 104 that respectively provide threaded openings 86 for adjustment screws 78. Bushings 104 respectively fit into four openings 106 through the main portion of spreader 66. Items 108 in contacting component 62 are mounting holes for receiving four flat-head screws that respectively screw into four openings 110 in socket 56 so as to mount component 62 on socket 58.

Items 112 in the implementation of FIGS. 4–8 are four pads provided on PCB 60. Each pad 112 has a clearance hole 114 and an alignment hole 116. Alignment pins (not shown) are inserted into holes 116 for aligning PCB 60 to an electro-mechanical interface, while flat-head screws (not shown) are inserted into holes 114 for connecting PCB 60 to the electro-mechanical interface. Items 118 are four additional mounting holes through PCB 60 for insertion of flat-head screws (not shown) to connect PCB 60 to the electro-mechanical interface.

Contacting component 62 in the implementation of FIGS. 4–8 is of circular outer lateral shape and has an outer diameter of approximately 100 mm. The length of each side of square-shaped central opening 70 in component 62 varies from implementation to implementation of device 40. Component 62 typically consists of steel but may consist of other materials such as copper with a ceramic insert. Each spreader 66 is of circular outer lateral shape and has an outer diameter of approximately 150 mm. The length of each side of square-shaped central opening 76 in spreader 66 varies with the implementation of device 40.

Figure 9A:
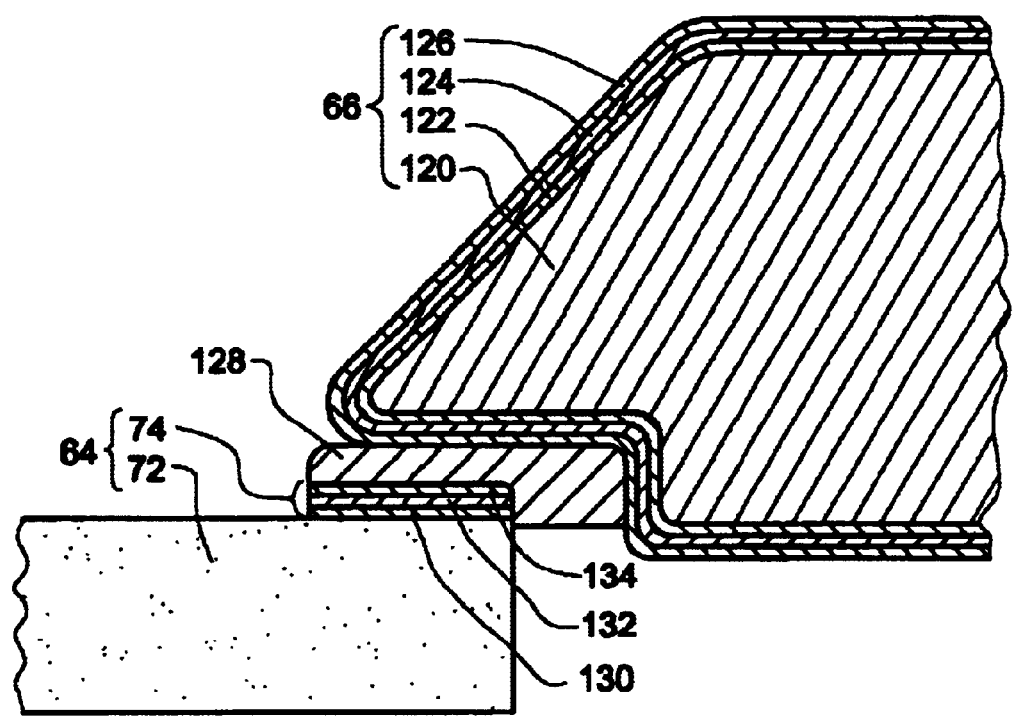
FIGS. 9a and 9b are cross-sectional side views of two implementations of a portion of the heat-sinking apparatus of FIG. 2.
Figure 9B:
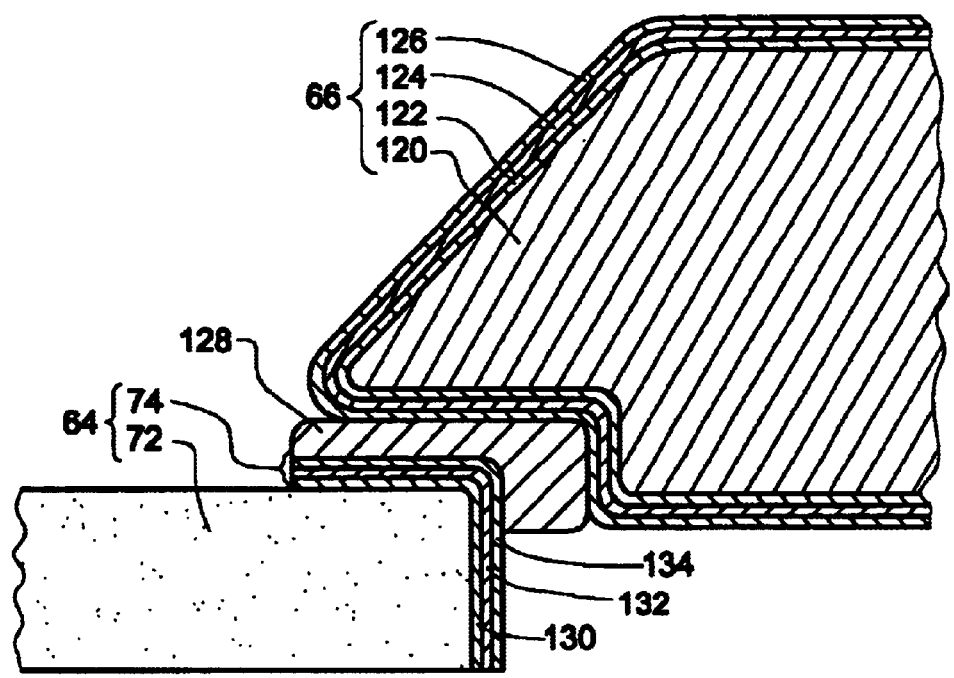

FIGS. 9a and 9b illustrate two implementations of a portion of the heat-sinking apparatus of FIG. 2 centered around the thermal connection between pane component 64 and heat spreader 66. In the implementation of each of FIGS. 9a and 9b, spreader 66 consists of a main spreader body 120, a first spreader layer 122 formed on main spreader body 120 at least in the vicinity of where component 64 is connected to spreader 66, a second spreader layer 124 formed on first spreader layer 122, and a spreader surface layer 126 formed on second spreader layer 124. Spreader body 120 consists largely of copper.

First spreader layer 122 consists largely of nickel deposited by electrolysis plating to a thickness of 40–80 μm. Second spreader layer 124 consists of nearly pure nickel deposited to a thickness of 40–80 μm. Spreader layers 122 and 124 together form an intermediate spreader layer 122/124 consisting largely of nickel.

Spreader surface layer 126 consists largely of gold deposited to a thickness of 100–150 μm. Intermediate nickel spreader layer 122/124 serves primarily as an adhesion layer for gold surface layer 126. Gold is more thermally conductive than nickel but does not adhere as well as to copper as nickel. The total thickness of spreader layers 122, 124, and 126 is typically 250 μm.

Pane surface region 74 is physically connected to spreader surface layer 126 through an interface region 128 consisting largely of indium solder. Indium adheres better to gold than to nickel or copper. The presence of gold surface layer 126 between indium interface region 128 and nickel intermediate layer 122/124 situated on copper spreader body 120 thereby enhances the thermal connection between pane surface region 64 and beat spreader 66 to improve the heat transport.

Pane surface region 74 consists of a lower pane layer 130, an intermediate pane layer 132 formed on lower pane layer 130, and a pane surface layer 134 formed on intermediate pane layer 132. Lower pane layer 130 extends in an annular manner along the outer lateral periphery of pane 72 and lies at least over its upper surface. In FIG. 9a, lower layer 130 lies only on the upper surface of pane 72 along its outer periphery. The lateral width of lower layer 130, and thus pane surface region 74, In FIG. 9a is typically 1–2 mm. FIG. 9b depicts a variation in which lower layer 130 extends over the outer lateral edge of pane 72. In that case, intermediate 132 and upper layer 134 also extend over the outer lateral edge of pane 72. Upper layer 134 connects to indium interface region 128.

Lower pane layer 130 consists of titanium deposited to a thickness of 10–20 μm. Intermediate pane layer 132 consists of platinum deposited to a thickness of 10–20 μm. Pane surface layer 134 consists of gold deposited to a thickness of 10–20 μm. The total thickness of pane surface region 74 is typically 50 μm.

Titanium adheres well to the diamond of pane 72. Gold adheres better to platinum than to titanium. Inasmuch as gold adheres well to indium, the combination of pane layers 130, 132, and 134 provides thermal connection between indium region 128 and pane 72. Hence, there is a good thermal connection between the diamond of pane 72 and the copper of main spreader body 120.

Interface region 128 is formed by placing indium solder on spreader surface layer 134 in the example of FIG. 9a or on the laterally extending portion of layer 134 in the example of FIG. 9b. The initial thickness of indium region 128 is typically 50 μm. The distance from the lateral edge of pane 72 to the lateral edge of the recessed part of heat spreader 66 at the general location for indium region 128 is typically 0.5 mm. Heat is applied to the indium to cause it to flow over gold surface layers 126 and 134. This reduces the thickness of interface region 128 to a value less than 50 μm, leading to the structure of FIGS. 9a or 9b depending on the configuration of spreader surface region 74.

While the invention has been described with respect to preferred embodiments, this description is solely for the purpose of illustration and is not be construed as limiting the scope of the invention claimed below. For example, pane component 64 can be eliminated. In that case, beat spreader 66 contacts semiconductor die 48 through indium solder placed along the inside recessed part of spreader 66. Various modifications and applications may thus be made by those skilled in the art without departing from the true scope of the invention as defined in the appended claims.

We claim:

1. An apparatus comprising:
   a contacting component for contacting a device;
   a pane component comprising a pane for contacting the device, the pane being substantially transparent to at least one of infrared, visible, and ultraviolet light;
   a heat spreader contacting, or connected to, the pane component; and
   an attachment mechanism for attaching the heat spreader to the contacting component across an adjustable spacing between the heat spreader and the contacting component, for adjusting the adjustable spacing, for exerting a primary force on the heat spreader toward the contacting component across the adjustable spacing to cause the device to exert a corresponding force on the pane, and for three-dimensionally restricting movement of the heat spreader relative to the contacting component across the adjustable spacing.

2. An apparatus as in claim 1 wherein the attachment mechanism comprises:
at least one adjustment element for adjusting the adjustable spacing; and
at least one attachment element for attaching the heat spreader to the contacting component across the adjustable spacing, for exerting the primary force on the heat spreader, and for three-dimensionally restricting the movement of the heat spreader relative to contacting component.

3. An apparatus as in claim 2 wherein each attachment element comprises:
a support element comprising (a) a post that extends through an opening in the heat spreader, (b) an attaching portion that extends from the post and attaches to the contacting component, and (c) a head that extends from the post opposite the attaching portion and is of greater diameter than the post; and
a spring that extends at least partway around the post between the head and the heat spreader.

4. An apparatus as in claim 2 wherein the attachment mechanism further includes at least one constraining element for three-dimensionally restricting movement of heat spreader relative to the contacting component to less than that three-dimensionally restricted by the at least one attaching element.

5. An apparatus as in claim 4 wherein each attachment element comprises:
a support element comprising (a) a post that extends through an opening in the heat spreader, (b) an attaching portion that extends from the post and attaches to the contacting component, and (c) a head that extends from the post opposite the attaching portion and is of greater diameter than the post; and
a spring that extends at least partway around the post between the head and the heat spreader.

6. An apparatus as in claim 1 further including a support structure for contacting the device and cooperating with the contacting component to hold the device.

7. An apparatus as in claim 1 wherein the primary force exerted by the attachment mechanism on the heat spreader varies across a small range whereby the further force exerted by the device on the pane varies across a small range.

8. An apparatus as in claim 1 wherein the device is a semiconductor device.

9. An apparatus as in claim 8 wherein the semiconductor device comprises:
a package for being contacted by the contacting component; and
a semiconductor die for being contacted by the pane, the die contacting the package.

10. An apparatus as in claim 1 further including a light source for directing light toward the pane from opposite the device so that the light passes through the pane and impinges on the device.

11. An apparatus as in claim 10 wherein the light source comprises a laser.

12. An apparatus as in claim 1 wherein the pane comprises diamond.

13. An apparatus as in claim 12 wherein:
the pane component includes a thermally conductive pane surface region situated on the pane;
the heat spreader comprises (a) a main spreader body comprising copper and (b) a spreader surface layer situated over the main spreader body and comprising gold; and
the apparatus includes a thermally conductive interface region that connects the pane surface region to the spreader surface layer.

14. An apparatus as in claim 13 wherein the interface region comprises indium.

15. An apparatus as in claim 13 wherein the heat spreader includes an intermediate layer situated between the main spreader body and the spreader surface layer, the intermediate layer comprising nickel.

16. An apparatus as in claim 15 wherein the interface region comprises indium.

17. An structure comprising:
a pane component comprising (a) a pane that comprises diamond and (b) a thermally conductive pane surface region situated on the pane;
a heat spreader comprising (a) a main spreader body comprising copper and (b) a spreader surface layer situated over the main spreader body and comprising gold; and
a thermally conductive interface region that connects the pane surface region to the spreader surface layer.

18. An structure as in claim 17 wherein the interface region comprises indium.

19. An stnicttire as in claim 17 wherein the heat spreader includes an intermediate layer situated between the main spreader body and the spreader surface layer, the intermediate layer comprising nickel.

20. An structure as in claim 19 wherein the interface region comprises indium.

21. An structure as in claim 17 wherein the pane surface region comprises a pane surface layer that comprises gold.

22. An structure as in claim 21 wherein the pane surface region includes:
a lower pane layer comprising titanium and connected to the pane; and
an intermediate pane layer comprising platinum and connecting the lower pane layer to the pane surface layer.

23. A method comprising:
contacting a device with a contacting component;
positioning, close to the device, a pane component of a composite mechanism that also includes (a) a heat spreader which contacts, or is connected to, the pane component and (b) an attachment mechanism which (b1) attaches the heat spreader to the contacting component across an adjustable spacing between the heat spreader and the contacting component and (b2) three-dimensionally restricts movement of the heat spreader relative to the contacting component across the adjustable spacing; and
adjusting the attachment mechanism to reduce the spacing between the heat spreader and the contacting component to cause a pane of the pane component to contact the device where the pane is substantially transparent to at least one of infrared, visible, and ultraviolet light.

24. An method as in claim 23 wherein, during the adjusting act, the attachment mechanism exerts a primary force on the heat spreader toward the contacting component across the adjustable spacing to cause the device to exert a corresponding force on the pane.

25. An method as in claim 23 wherein the device is a semiconductor device.

26. An method as in claim 23 further including, subsequent to the adjusting act, directing light on the pane from opposite the device so that the light passes through the pane and impinges on the device.

27. An method as in claim 26 wherein the light is supplied from a laser.

28. An method as in claim 23 wherein the pane comprises diamond.

* * * * *